United States Patent
Talbot

Patent Number: 5,833,479
Date of Patent: Nov. 10, 1998

[54] SURFACE MOUNT TEST POINT ENABLING HANDS-FREE DIAGNOSTIC TESTING OF ELECTRONICAL CIRCUITS

[75] Inventor: Andrew Talbot, Church Crookham, United Kingdom

[73] Assignee: Nokia Telecommunications Oy, Espoo, Finland

[21] Appl. No.: 640,980
[22] PCT Filed: Sep. 13, 1995
[86] PCT No.: PCT/FI95/00497
  § 371 Date: Jun. 27, 1996
  § 102(e) Date: Jun. 27, 1996
[87] PCT Pub. No.: WO96/08728
  PCT Pub. Date: Mar. 21, 1996

[30] Foreign Application Priority Data

Sep. 15, 1994 [GB] United Kingdom .................. 9418639

[51] Int. Cl.⁶ .................................................. H01R 9/09
[52] U.S. Cl. ............................ 439/83; 324/72.5; 439/888
[58] Field of Search .................... 439/78, 888; 324/72.5; 174/267

[56] References Cited

U.S. PATENT DOCUMENTS

| | | | |
|---|---|---|---|
| 3,044,151 | 7/1962 | Coler | 439/85 |
| 3,061,760 | 10/1962 | Ezzo | 439/85 |
| 3,329,851 | 7/1967 | Braeutigam et al. | 439/41 |
| 5,446,393 | 8/1995 | Schaefer | 324/754 |

FOREIGN PATENT DOCUMENTS

| | | |
|---|---|---|
| 191 275 | 1/1923 | United Kingdom . |
| 1 416 950 | 12/1975 | United Kingdom . |

OTHER PUBLICATIONS

Unknown author: "Testen von Hybriden und SMD–Schaltungen", Funkschau, No.12, Jun. 1988, pp. 57–58.

Stadler: "Viktigt att konstruera for provning", Elteknik Med Artuell Elektronik, No. 8, Apr. 1988, pp. 59–60, especially portion Konstruera for provning pa kortet.

Lyman et al: "Surface mounting provokes test challenges; integrating CAD and testing cuts production costs", Electrons Week, vol. 57, No. 25, Oct. 1984, pp. 50–53, especially portion Fixtures and probes (p.51).

*Primary Examiner*—Neil Abrams
*Assistant Examiner*—T. C. Patel
*Attorney, Agent, or Firm*—IP Group of Pillsbury Madison & Sutro LLP

[57] ABSTRACT

A test point enabling hands-free diagnostic testing of electronical circuits, has a body with two planar, at least substantially parallel end surfaces which are spaced apart and face opposite directions. The end surfaces are connected with each other by a waist portion which is in electrical contact with at least one of the end surfaces.

11 Claims, 1 Drawing Sheet

SURFACE MOUNT TEST POINT ENABLING HANDS-FREE DIAGNOSTIC TESTING OF ELECTRONICAL CIRCUITS

This application claims benefit of international application PCT/FI 95/00497, filed Sep. 13, 1995.

BACKGROUND OF THE INVENTION

The invention relates to a test point enabling hands-free diagnostic testing of electronical circuits. Printed circuit boards (PCB) as well as other electronical circuits need to be tested and adjusted. In order to facilitate such testing it is known to use test points which allow the test engineers to work "hands free" while setting and adjusting the test equipment. The test points allow the test engineer to attach hook type test probes and log results without having to hold the test probes, used for this purpose.

The test points used today for this purpose are in the form of a loop which is soldered to the PCB with one or two copper pad pieces on the PCB to be tested. Typically, the loop-type test points require a hole through the PCB (which may be plated through), and there must be at least one pad on the underside of the PCB, which takes board space on the underside of the PCB, which is not required with surface mount technology. A pad is required on both the upperside and the underside of the PCB linked with a plated through hole, if the signal to be tested is on the upper side of the board. The loop-type test point has to be hand-fitted and is often hand-soldered, which makes it expensive and difficult to justify.

SUMMARY OF THE INVENTION

The object of the present invention is to eliminate the above problems. To achieve this, the test point of the invention it comprises a body with two planar, at least essentially parallel end surfaces which are spaced apart and face opposite directions, the end surfaces being connected to each other by a waist portion which is in electrical contact with at least one of the end surfaces. The diameter of the waist portion is smaller than the diameter of the end portions: the diameter of the waist portion is chosen to fit in the hooks of common type test probes. The body is preferably symmetrical and made in one piece of a conducting metal such as brass or copper, the diameter of the end surfaces being somewhat larger than the height of the body. This makes the test point suitable for use in a surface mount device (SMD) machine of standard type. In this case, the test points are placed in a surface mount device (SMD) tape of standard type. The present invention also concerns a surface mount device (SMD) tape provided with test points according to the present invention.

The most important advantage of the present surface mount test point are that it is very easy to mount on printed circuit boards, it is suitable for machine mounting in solder paste which has been applied to the test point pad and can be soldered in a reflow oven. A copper surface of approximately ten square millimeters suffices to function as a mounting base for the test point. The test point can be supplied in a standard 8 mm wide surface mount device tape and can thus be reel mounted. The flat end surfaces of the test point according to the invention allow the test point to be picked up with standard vacuum nozzles. When the diameter of the end portions is larger than the distance between them, the test point is stable and keeps an upright position, which makes it more reliable to fit. A symmetric test point is preferred, because symmetry makes the test point non handed and subsequently easier to mount in the tape and place on the PCB.

BRIEF DESCRIPTION OF THE DRAWINGS

In the following, the invention will be illustrated by means of one preferred embodiment with reference to the attached drawing, in which.

DETAILED DESCRIPTION

Figure 1:
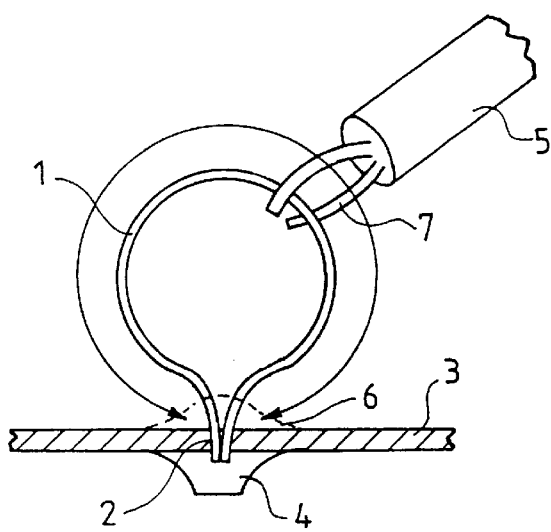
FIG. 1 shows a commonly used loop-type test point mounted on a printed circuit board and seen from the side.

FIG. 1 shows a known loop-type test point. The loop 1 is made of a copper wire having semicircular cross-section so that the ends of the wire are easy to put through the small hole 2 in the printed circuit board (PCB) 3 with the flat sides of the wire facing each other. The hole 2 may be plated through. A copper pad 4 is needed on the underside of the PCB 3, if the signal to be measured with the probe 5 is on the underside of the PCB. If the signal to be measured is on the upperside of the PCB, still another copper pad 6 is needed. The hooks 7 of the probe 5 grip the loop 1. The arrow in FIG. 1 shows that the test probe 5 can be attached to the loop through an angle of 180°.

Figure 2:
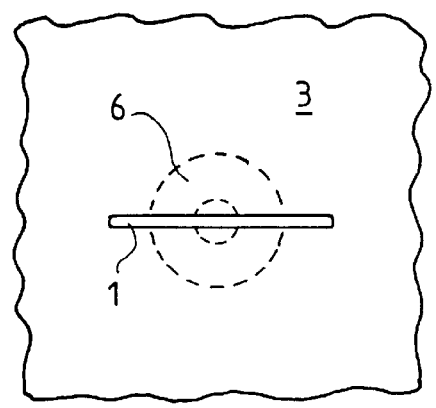
FIG. 2 shows the test point of FIG. 1 seen from above.

FIG. 2 shows the loop-type test point seen from above. For the sake of simplicity the test probe 5 has not been illustrated in this figure.

The problems with the known loop-type test point have been discussed in the above.

Figure 3:
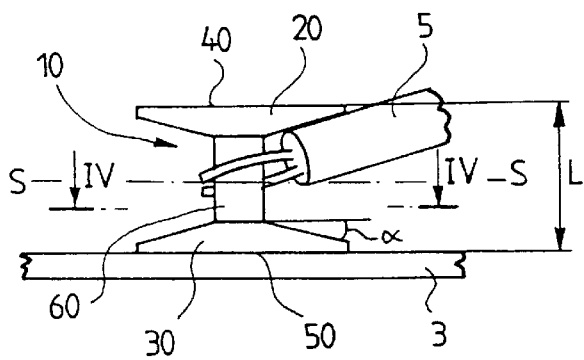
FIG. 3 shows the test point according to the present invention seen from the side.
Figure 4:
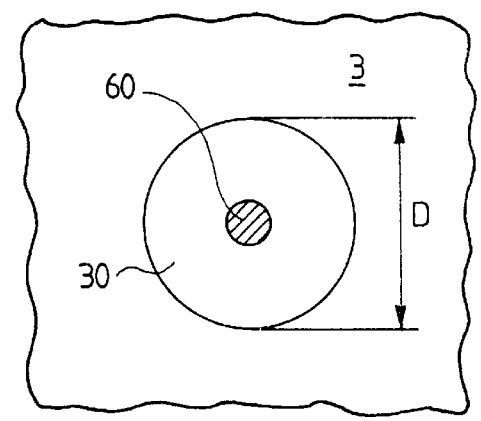
FIG. 4 is a sectional view along the line IV—IV of FIG. 3, and FIGS. 5 and 6 show a surface mount device tape with test points according to FIG. 3 placed in the pockets thereof.

FIGS. 3 and 4 show a surface mount test point according to the present invention. The test point is formed of a body 10 in the shape of a cotton reel (i.e, in the shape of a spool for sewing thread) having an axially central spindle terminating in two opposite end flanges which are larger in diameter than the spindle. Thus it has two truncated cone portions 20 and 30, each having a planar end surface 40 and 50, respectively. The end surfaces 40, 50 are parallel or almost parallel to each other. Between the cone portions 20, 30 there is a waist portion 60. The test point shown in FIGS. 3 and 4 is symmetrical to a plane S—S, which is parallel to the end surfaces 40, 50 and which is situated at an equal distance from the end surfaces. The test point 10 is mounted on a copper surface of the PCB 3. A square or round copper pad where the side length/diameter is 3 millimeters is enough to get the test point firmly soldered to the PCB. Even a smaller surface is sufficient for the mounting. The diameter D of the end surface 40 is preferably 2 to 4 mm. The distance L between the end surfaces 40 and 50 is approximately 2 mm. It is preferable that the distance L be 0.5 to 0.8 times the diameter D to keep the test point 10 stable and in the correct orientation in the carrier tape and when placed in the solder paste on the PCB. The diameter of the waist portion is approximately 1 mm.

As can be seen from FIG. 3, the mantle surfaces of the truncated cone portions are at an angle $\alpha$=about 20° with respect to the end surfaces 40, 50. The angle $\alpha$ is preferably between 0° and 40° and most preferably between 10° and 30°. When the end portions of the test point have the shape of the cone, the test point possesses better rigidity than if the angle a is very small. A fillet radius between the end surfaces and the waisted portion is also permissible. When the test point 10 has the geometry as shown in FIG. 3, the probe 5 can be attached to the test point at an angle of 0° to about 30°. The probe 5 can be turned 360° around the test point 10.

FIG. 4 is a sectional view of the test point taken along line IV—IV of FIG. 3. As can be seen, the waist portion 60 has a round transverse cross-section.

The surface mount test point is made in one piece of solid brass. The test point is preferably plated with tin/gold or some material to maintain its solderable life and prevent oxide buildup.

Figure 5:
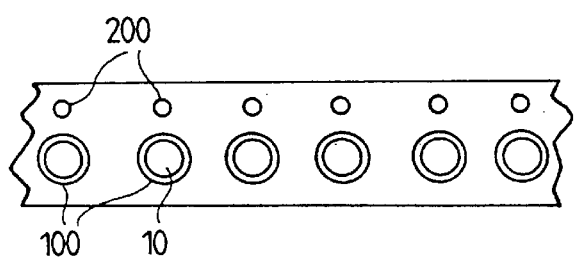
Figure 6:
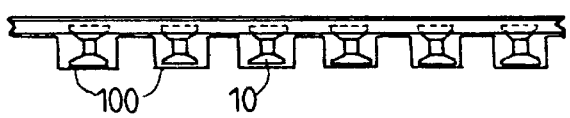

FIGS. 5 and 6 show a surface mount device (SMD) tape of standard 8 mm wide type in a top view and a side view, respectively, provided with pockets 100 for electronical components such as resistors, diodes and capacitors. Reference numeral 200 designates tape drive holes. In FIGS. 5 and 6, the pockets have been filled with surface mount test points 10 mounted on their end faces so as to present the SMD placement Machine Vacuum nozzle with a flat face according to the invention. The test points according to the invention can be reel mounted to enable them to be SMD machine placeable.

The invention has been described above only by way of example, and it is therefore pointed out that the invention can be modified in many ways within the scope of the claims. Thus, the body 10 need not be symmetrical although this is very desirable; and the end/waisted portions can have any cross sectional shape, e.g. a shape of a truncated pyramid. Instead of brass, the test point can be manufactured of copper or some other metal with good electrical conductivity. In order to save material costs, it is in principle possible to manufacture the test point of any material with sufficient rigidity and durability in temperatures used for soldering, whereby e.g. only the surface is made conductive. In principle, it is sufficient if one end surface is in good electrical contact with the waist portion. This would, however, require correct orientation of the test point so that the conducting end surface is against the PCB.

I claim:

1. A surface mount test point enabling hands-free diagnostic testing of electronic circuits, comprising:
   a body having two axially spaced, axially opposite end flanges which are physically interconnected by a waist portion which extends between said end flanges;
   said end flanges having respective axially outer surfaces which are substantially planar and disposed in planes which are substantially parallel to one another;
   said waist portion and at least one of said axially outer surfaces being made of electrically conductive metallic material, and being in electrical contact with one another; and
   said one of said axially outer surfaces being solderable to a printed circuit board for surface mounting said test point to the printed circuit board.

2. The test point of claim 1, wherein:
   the other of said axially outer surfaces also is made of electrically conductive metallic material, and is in electrical contact with said waist portion.

3. The test point of claim 1, wherein:
   said end flanges and said waist portion are each circular in transverse cross-sectional profile; and
   each end flange further includes an annular radially inner frusto-conical surface.

4. The test point of claim 3, further comprising:
   a respective radiused fillet disposed between said waist portion and each said frusto-conical surface.

5. The test point of claim 3, wherein:
   on each said end flange, the respective frusto-conical surface is disposed at an angle of between 0° and 40° to the respective axially outer surface.

6. The test point of claim 2, wherein:
   said end flanges and said waist portion are each circular in transverse cross-sectional profile;
   each end flange further includes an annular radially inner frusto-conical surface; and
   said body is symmetrical about an imaginary plane which bisects said waist portion at a right angle to the longitudinal axis of said waist portion, midway between said planes of said axially outer surfaces.

7. The test point of claim 1, wherein:
   said body is made of solid metal in one piece.

8. The test point of claim 2, wherein:
   said axially outer surfaces are equal in diameter and are axially spaced from one another by a distance which is from 0.5 to 0.8 times the diameter of each said axially outer surface.

9. The test point of claim 1, wherein:
   said body is made of tin-plated brass.

10. The test point of claim 9, wherein:
    each said axially outer surface has a diameter of from 2 to 4 mm.

11. A test point placement assembly, comprising:
    a surface mount device tape having a longitudinal series of pockets and a longitudinal series of tape drive engagement features;
    each of aid pockets extending in a thickness direction of said tape and having disposed therein, for placement by a surface mount device placement machine vacuum nozzle, a respective surface mount test point enabling hands-free diagnostic testing of electronic circuits;
    each said test point comprising:
       a body having two axially spaced, axially opposite end flanges which are physically interconnected by a waist portion which extends between said end flanges;
       said end flanges having respective axially outer surfaces which are substantially planar and disposed in planes which are substantially parallel to one another;
       said waist portion and at least one of said axially outer surfaces being made of electrically conductive metallic material, and being in electrical contact with one another; and
       said one of said axially outer surfaces being solderable to a printed circuit board for surface mounting said test point to the printed circuit board.

* * * * *